United States Patent
Kajihara

(10) Patent No.: US 7,710,221 B2
(45) Date of Patent: May 4, 2010

(54) ELASTIC WAVE DEVICE

(75) Inventor: Ryuji Kajihara, Saitama (JP)

(73) Assignee: Nihon Dempa Kogyo Co., Ltd. (JP)

( * ) Notice: Subject to any disclaimer, the term of this patent is extended or adjusted under 35 U.S.C. 154(b) by 156 days.

(21) Appl. No.: 12/145,833

(22) Filed: Jun. 25, 2008

(65) Prior Publication Data

US 2009/0002099 A1      Jan. 1, 2009

(30) Foreign Application Priority Data

Jun. 29, 2007   (JP)   ............. 2007-173434

(51) Int. Cl.
*H03H 9/00* (2006.01)
*H03H 9/48* (2006.01)
*H01L 41/04* (2006.01)

(52) U.S. Cl. .............. 333/193; 333/194; 310/313 D

(58) Field of Classification Search ........... 333/133, 333/193, 194, 195, 196; 310/313 R, 313 A, 310/313 B, 313 C, 313 D
See application file for complete search history.

(56) References Cited

U.S. PATENT DOCUMENTS

| | | | | |
|---|---|---|---|---|
| 3,833,867 A | * | 9/1974 | Solie | ............. 708/815 |
| 4,894,576 A | * | 1/1990 | Okamoto et al. | ......... 310/313 D |
| 5,793,146 A | * | 8/1998 | Wright | .............. 310/313 B |
| 5,896,071 A | * | 4/1999 | Dai et al. | ................ 333/193 |
| 6,331,747 B2 | * | 12/2001 | Yoshida et al. | .......... 310/313 R |
| 6,380,828 B1 | * | 4/2002 | Liu et al. | ................ 333/193 |
| 7,075,390 B1 | * | 7/2006 | Bungo et al. | ............... 333/193 |
| 7,589,451 B2 | * | 9/2009 | Morita et al. | .......... 310/313 R |

* cited by examiner

*Primary Examiner*—Dean O Takaoka
(74) *Attorney, Agent, or Firm*—Andrus, Sceales, Starke & Sawall, LLP

(57) ABSTRACT

In an elastic wave device including an input side electrode and an output side electrode being a resonant single-phase unidirectional transducers (RSPUDT) provided with respective pairs of bus bars opposing to each other on a piezoelectric substrate and a number of excitation electrode fingers extending in a comb-teeth shape so as to respectively cross each other from the respective bus bars, the elastic waves are repeatedly reflected and amplified between the central part of the input side electrode and the central part of the output side electrode along the direction of extension of the respective bus bars by the excitation electrode fingers of the input side electrode and the output side excitation electrode, the elastic wave device includes a damper at least on either one of the input side bus bar or the output side bus bar in an area between the central part of the input side electrode in the direction of movement of the elastic waves and the central part of the output side electrode in the direction of movement of the elastic waves so that the energy leaked out into the bus bar is absorbed.

5 Claims, 12 Drawing Sheets

FREQUENCY(MHz)

FREQUENCY(MHz)

ELASTIC WAVE DEVICE

BACKGROUND OF THE INVENTION

1. Field of the Invention

The present invention relates to an elastic wave device which repeatedly reflects an elastic wave between an input side electrode and an output side electrode device.

2. Description of the Related Art

A SAW (surface acoustic wave) filter being an elastic wave device is used, for instance, in the transmitting and receiving unit of a portable terminal, and there is a device using a resonant single-phase unidirectional transducers (RSPUDT) as its example. FIG. 10 shows the structure of a SAW filter of this kind, in which 11 is a piezoelectric substrate. The piezoelectric substrate 11 includes an input side resonant single-phase unidirectional transducers (RSPUDT) 12, an output side resonant single-phase unidirectional transducers (RSPUDT) 13 and a shield electrode 14. The respective resonant single-phase unidirectional transducers 12 and 13 include bus bars 15a and 15b, a number of exciting interdigital transducers 16 for reflecting the SAW and a number of dummy electrodes 17 which are shorter than the interdigital transducer 16 and not contributing to the excitation. The role of the dummy electrode 17 will be explained later. In general, the one-way electrode shows a wide filter characteristic being the characteristic of a transversal type filter when the reflection of the electrode is weak, while when the reflection is stronger, its internal reflection becomes stronger, and the electrode shows narrow filter characteristics close to the characteristics of a resonator type filter.

In the resonant single-phase unidirectional transducers which has a strong internal reflection, the reflection plane confining SAW energy exists in the propagation direction of the SAW (on the extensional direction of the bus bar). The reflection plane exists in the vicinity of the center in the propagation direction of the SAW in respective interdigital transducers 16 on the input side and the output side. The one-way electrodes 12 and 13 are configured such that by utilizing multiple reflections between the reflection planes so that the SAW can be strongly propagated only in one direction from the input side to the output side. In addition, the width and the distance of arrangement of the interdigital transducer 16 are appropriately adjusted so that the SAW is propagated in this way.

In such a SAW filter 1 having the resonant single-phase unidirectional transducers 12 and 13, of which internal reflection is strong as described above, the SAW energy is concentrated on the reflection planes, which causes the following problems. For instance, the surface wave 10a which propagates through an electrode finger formation area 18 surrounded by a chain line in the figure as shown in FIG. 11A originally advances in a rectangular shaped wave, however, it sometimes happens that as the wave reflects and propagates, its waveform is deformed, and the wave is incident on a boundary between the electrode finger formation area 18 and the bus bars 15a, 15b. When the electrode finger formation area 18 is taken as a medium, the bus bars 15a, 15b and the electrode finger formation area 18 are different in medium from each other where the medium is concerned, and due to the difference in medium, the wave incident on the boundary surface causes reflection. Then, the lateral mode waves run high vertically distributing relative to the propagating direction of the SAW for which the electrode finger formation area 18 serves as a wave guide. The rectangular wave 10a becomes a sine wave 10b being a primary mode (ordinary mode) as shown in FIG. 11B, and further, a higher mode wave in a lateral mode such as the wave 10c in a tertiary mode, a fifth mode, a seventh mode or the like (these are not shown) appears.

When only the sine wave 10b moves forward through the electrode finger formation area 18, the SAW filter 1 shows a filter characteristic shown by a solid line in FIG. 12A, and the above-described respective higher mode waves have propagation areas where the signs of the electric charges induced in the interdigital transducers 16 are opposite to each other. In other words, when the higher mode waves propagate over the electrode finger formation area 18, for instance, a positive charge is induced in a certain interdigital transducer 16, and a negative charge is induced at another interdigital transducer 16, so that the balance of the energy of the electric charge in the electrode finger formation area 18 is disturbed. Then, the energy of the electric charge leaks out from the center side of the electrode finger formation area 18 into the vicinity of the bus bar 15a and 15b respectively, which causes an influence in the excitation of the interdigital transducer 16, so that an amplitude characteristic exhibiting the peak on the higher band area than the central frequency of the sine wave 10b appears, for instance, shown by a chain line and a two-dot chain line in FIG. 12A. When the sine wave 10b and higher mode waves repeat reflection in the electrode finger formation area 18 and resonate so as to be in a resonance mode, the characteristics of the respective waves are added to become a filter characteristic shown in FIG. 12B. In other words, the SAW filter 1 is, as shown by the area surrounded by the chain line, to possess a characteristic in which the spuriousness appears in a damping band on the higher band side than the pass band. As above, generation of higher mode waves in a lateral mode and occurrence of resonance are verified in a simulation study in non-Patent Document 1.

Then, in the SAW filter 1, the length of the interdigital transducer 16 is adjusted and the dummy electrode 17 is disposed, and further, the ratio of the aperture (W) of the electrode finger to the width of opening (WO) of the electrode finger from the respective bus bars 15a and 15b is adjusted. By this adjustment, when the higher mode wave is propagated, the electric charge opposite in sign to the electric charge induced by the interdigital transducer 16 existing on the extension is induced in the dummy electrode 17, so that the positive and negative charges in the electrode finger formation area 18 are cancelled so as to be close to zero. Thus, by preventing lowering of the excitation of the interdigital transducer 16, reduction of the spuriousness is expected. Such an electrode configuration (W/WO configuration) is described in Patent Document 1.

In such a W/WO configuration, when the width of crossing W is large, the spuriousness in the lateral mode is likely to occur in a plurality of cases, though it is possible to reduce the occurrence of the spuriousness by narrowing the aperture W, there arises problems that the desired filter characteristic cannot be obtained due to the high impedance and widening of the band width. Thus, since there is limitation on controlling the W/WO ratio, it is still insufficient to reduce the energy of the electric charge generated by the higher mode waves, and the energy still remaining in a high level leaks out into the vicinity of the bus bars 15a and 15b from the central side in the direction of distribution of the lateral mode, resulting in generation of the spuriousness.

Patent Document 2 shows a SAW filter in a configuration such that a damper is applied on the bus bar part parallel to the direction of propagation of waves. The SAW filter, however, is a transversal type filter using an apodized electrode, and has a configuration in which there is no occurrence of internal reflection in the electrode finger formation area. The damper is used for the purpose of preventing reflecting waves from a tip terminal face parallel to the direction of propagation of the SAW, and not for the purpose of reducing the spuriousness in a higher lateral mode. Therefore, the invention described in Patent Document 2 is not to solve the problems which the above-described spuriousness creates. Patent Document 3 describes a SAW filter which has a damper applied on a bus bar of an input/output electrode thereof and reduces generation of spuriousness by preventing unification of bulk waves and pseudo surface acoustic waves. However, there is no reference to the position of the damper on the bus bar.

[Patent Document 1] Japanese Patent Application Laid-open No. Hei 9-260996

[Patent Document 2] Japanese Patent Application Laid-open No. Hei 9-205341

[Patent Document 3] Japanese Patent Application Laid-open No. Hei 6-232682

[non-Patent Document 1] Marc Solal et al. Design Modeling and Visualization of Low Transverse Modes R-SPUDT Devices 2006 IEEE Ultrasonics Symposium

SUMMARY OF THE INVENTION

The present invention is made based on the above-described circumstances, and the object thereof is to provide an elastic wave device which can reduce spuriousness due to a lateral mode and can maintain a favorable pass filter characteristic in the elastic wave device provided with an input side electrode and an output side electrode composed of a resonant single-phase unidirectional transducers.

The elastic wave device of the present inventions including: an input side electrode which is a resonant single-phase unidirectional transducers provided with a pair of input side bus bars opposing to each other on a piezoelectric substrate; an output side electrode which is a resonant single-phase unidirectional transducers, disposed on the extension line of the respective input side bus bars on the piezoelectric substrate, and provided with a pair of output side bus bars opposing to each other;

a number of excitation electrode fingers extending into a comb-teeth shape so as to cross each other between these input side bus bar, output side bus bar from the respective input side bus bars and the respective output side bus bars, for the purpose of conducting repeated reflection and amplification of elastic waves between the central part of the input side electrode and the central part of the output side electrode along the direction of extension of the respective bus bar to propagate the elastic waves from the input side electrode to the output side electrode; and a damper provided at least on either one of the input side bus bar or the output side bus bar in an area between the central part of the input side electrode in the direction of movement of the elastic waves and the central part of the output side electrode in the direction of movement of the elastic waves.

The value obtained by dividing the distance from the central part between the input side terminal of the input side bus bar and the output side terminal of the output side bus bar to the position where the damper is applied, with the distance from the central part to the input side terminal of the input side bus bar or the distance from the central part to the output side terminal of the output side bus bar, is 0.2 or less for instance. It is also acceptable that, for instance, the damper is applied so as not to fall on the electrode finger, and a dummy electrode is provided for neutralizing the electric charge in the electrode finger formation areas surrounded by the respective input side bus bar and output side bus bar which extend from the oppos-ing bus bars, on the extension of the excitation electrode finger in the input side bus bar and the output side bus bar. In addition, a shield electrode may be provided lying between the input side electrode and the output side electrode.

In an elastic wave device provided with an input side electrode and an output side electrode formed of a resonant single-phase unidirectional transducers, since the energy of the elastic waves is concentrated in an area between the central part of the input side electrode and the central part of the output side electrode in the direction of movement of the elastic waves, the higher mode waves in a lateral mode being a component to create the spuriousness also concentrates in this area similarly. Then, by providing a damper at least either one of the bus bar of the input side electrode or the bus bar of the output side electrode between the central parts in the propagation direction of the elastic waves of the respective electrodes, even when the energy of the electric charge of the higher mode waves in a lateral mode leaks out in the vicinity of the bus bar, the energy thereof is absorbed by the damper. Accordingly, the energy of the electric charge reduces the influence of the electrode finger excitation, which causes reduction in the spuriousness. This configuration ensures a large effect of the damper, because as the order of the higher mode wave increases, the amount of energy coming out in the vicinity of the bus bar from the electrode finger formation area increases. Since the energy of waves in an ordinary mode concentrates on the vicinity of the central part between the bus bars, the influence giving to the ordinary mode is a little. Therefore, only the spuriousness can be reduced, and little influence is given to the pass filter characteristics.

DETAILED DESCRIPTION OF THE PREFERRED EMBODIMENT(S)

Figure 1:
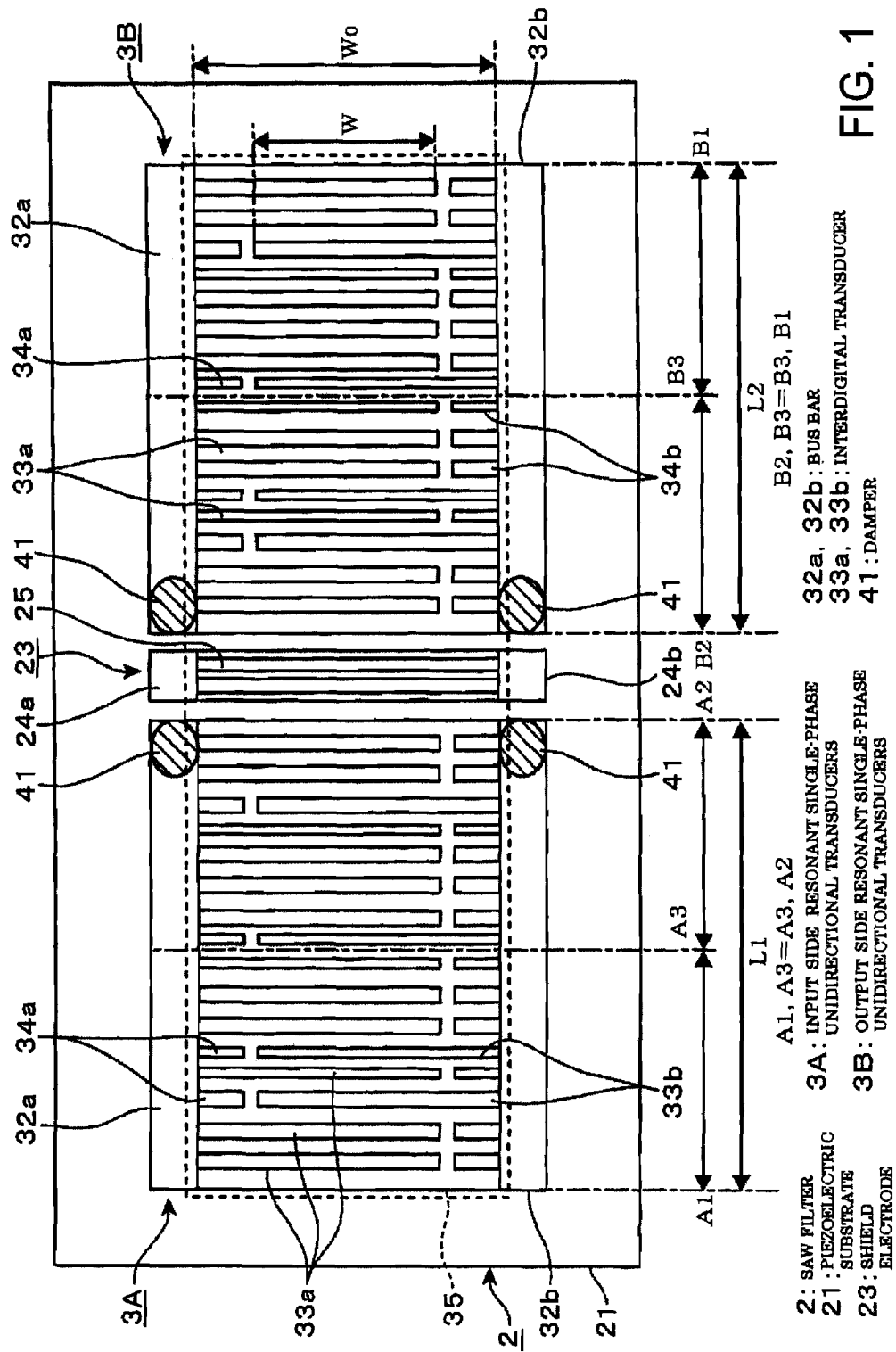
FIG. 1 is a view showing the whole configuration of a SAW filter relating to an embodiment of the present invention.

A SAW filter 2 being an example of the elastic wave device of the present invention will be explained referring to FIG. 1. The SAW filter 2 is manufactured for a GSM base station with a relative band width of 0.18% using a ST cut quartz wafer, and configured with filter characteristics of 240 MHz. In the figure, 21 is a piezoelectric substrate, and a resonant single-phase unidirectional transducers (RSPUDT) 3A forming an input side electrode and a resonant single-phase unidirectional transducers (RSPUDT) 3B forming an output side electrode are formed on the left and right on the surface of the piezoelectric substrate 21, sandwiching a shield electrode 23.

The resonant single-phase unidirectional transducers 3A on the input side includes a pair of bus bars 32a and 32b vertically opposing seen from the plane of the drawing and extending in parallel to the lateral direction (in the propagation direction of the SAW). A number of interdigital transducers 33a and 33b for propagating the SAW are extending from the bus bars 32a and 32b toward the opposing bus bars 32b and 33a respectively in a comb teeth shape.

In these interdigital transducers 33a and 33b, as described in the related art, the distance of arrangement and the degree of width (the length parallel to the bus bars 32a and 32b) are determined so as to perform multiple reflections of the SAW between the central part of the resonant single-phase unidirectional transducers 3A and the central part of the resonant single-phase unidirectional transducers 3B in the propagation direction of the SAW so that it can be strongly propagated from the input side (on the left in the figure) to the output side (on the right in the figure). These interdigital transducers 33a and 33b are not concretely arranged in equal intervals alternately, it has a configuration such that one or more parts of the interdigital transducers 33a are sandwiched between the interdigital transducers 33b and 33b and at the same time one or more parts of the interdigital transducers 33b are sandwiched between the interdigital transducers 33a. Besides, the size of the width of respective interdigital transducers 33a and 33b (the length parallel to the bus bars 32a and 32b) are not all the same. Note that the interdigital transducers 33a, 33b and the dummy electrodes 34a, 34b which will be described later are schematically shown, and the actual size, the number, and the arrangement intervals are different from FIG. 1.

The dummy electrode 34a extending from the bus bar 32b is provided on the extension of the interdigital transducer 33a, and the dummy electrode 34b extending from the bus bar 32a is provided on the extension of the interdigital transducer 33b respectively, and the size of the widths of the respective dummy electrodes 34a and 34b are formed so as to be the same as that of the width of the interdigital transducer 33 on the extension in the extending direction of the respective dummy electrodes 34.

The respective dummy electrodes 34 do not contribute to the oscillation, and serve to neutralize the electric charge excited on the interdigital transducers 33a and 33b, to take balance of the positive electric charge and the negative electric charge in an electrode finger formation area 35 and to allow the energy thereof to come close to being zero, and to reduce the electric charge energy leaked out from in the vicinity of the bus bars 32a and 32b respectively by being positively or negatively charged when the higher mode waves in a lateral mode propagate through the electrode finger formation area (grating area) 35 surrounded with a chain line in the figure as shown in the section of the related art.

The resonant single-phase unidirectional transducers 3B on the output side is configured similarly to the resonant single-phase unidirectional transducers 3A, and the respective parts are shown by attaching the same symbols and numerals as the one-way electrode 3A. The number, the width, and the arrangement intervals of the respective interdigital transducers 33a and 33b are determined so as to perform multiple reflections of the SAW between the vicinity of the center of the resonant single-phase unidirectional transducers 3A and the vicinity of the center of the resonant single-phase unidirectional transducers 3B so that the SAW can be strongly propagated from the input side to the output side. It should be noted that the distance L1 between the input/output side terminals A1 and A2 of the resonant single-phase unidirectional transducers 3A and the distance L2 between the input/output side terminals B1 and B2 of the resonant single-phase unidirectional transducers 3B in the propagation direction of the SAW are described as being equal, but they may differ from each other and the number of the respective electrode fingers 33a, 33b, 34a and 34b may differ from each other respectively.

In the one-way electrode 3A, the interdigital transducers 33a and 33b provided in the vicinity of the central part A3 (the length between A1 and A3=the length between A3 and A2) between the terminals A1 and A2, and the interdigital transducers 33a and 33b placed in the vicinity of the central part B3 (the length between B1 and B3=the length between B3 and B2) between the terminals B1 and B2 in the one-way electrode 3B form surfaces to reflect the SAW as explained in the section of the related art, and the SAW performs multiple reflection between the respective central part A3 and B3 of the respective one-way electrodes 3A and 3B in the electrode finger formation area 35 by these reflecting surfaces, so that the SAW is strongly propagated in one direction from the input side to the output side of the filter 2.

The ratio W/WO of the width of crossing (W) between the interdigital transducer 33a extending from the bus bar 32a and the interdigital transducer 33b extending from the bus bar 32b, and the length of opening (WO) between the bus bar 32a and 32b is 0.85.

The shield electrode 23 is provided with 24a and 24b parallel to the respective bus bars 32a, 32b and an electrode finger 25 connecting between the respective bus bars 24a and 24b, and has the function of reducing electromagnetic and electrostatic bonding of the input side one-way electrode 3A and the output side one-way electrode 3B, so that the floor level on the out-of-band is improved.

A damper 41 will be explained next. The damper 41 is composed of, for instance, a silicon adhesive, and is applied to a total of 4 places, the output side terminals on the bus bars 32a, 32b of the one-way electrode 3A, and the input side terminals on the bus bars 32a, 32b of the one-way electrode 3B in a circle adjusting the width (vertical direction in the figure) of the respective bus bars 32a and 32b so as not to be applied on the electrode fingers 33a, 33b, 34a and 34b.

Figure 2:
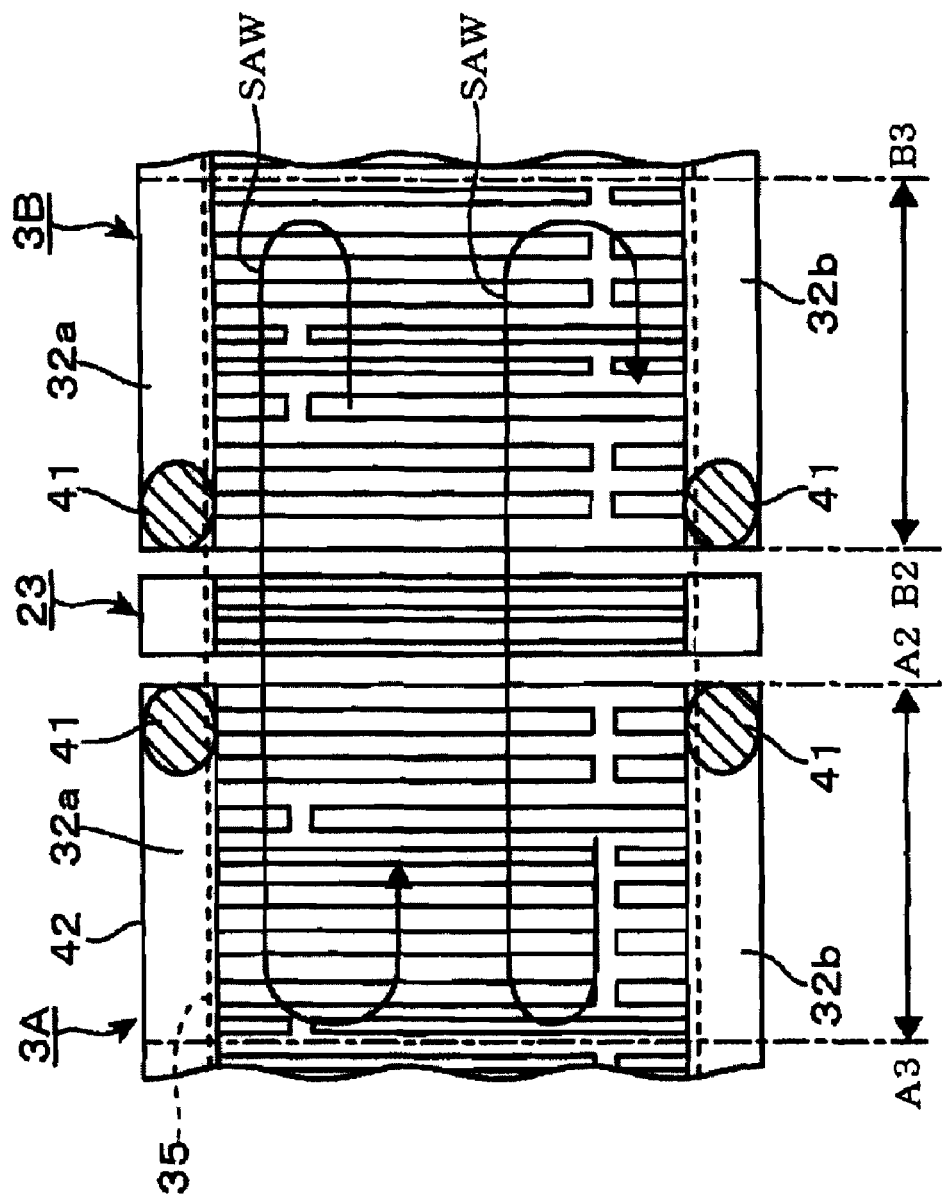
FIG. 2 is an explanatory view showing a propagation manner of the SAW and an application area of a damper.

As described above, the multiple reflections of SAW start as shown by the solid line arrows in FIG. 2 between the central parts A3 and B3 of the respective one-way electrodes 3A and 3B in the electrode finger formation area 35. In other words, the SAW energy is to be concentrated between the central parts A3 and B3 in the electrode finger formation area 35 between these A3 and B3, and accordingly, a higher mode being the cause of the creation of a spuriousness is apt to be generated the central parts A3 and B3. Accordingly, by applying the damper 41 as shown in the figure, it is possible to reduce the electric charge energy created due to the higher mode generated in the electrode finger formation area 35, and leaked out in the vicinity of the bus bars 32a and 32b.

As above, in the SAW filter 2, since the damper 41 is applied on the output side terminal of the bus bars 32a and 32b of the input side resonant single-phase unidirectional transducers 3A, and the input side terminal of the bus bars 32a and 32b of the output side resonant single-phase unidirectional transducers 3B, higher mode waves in lateral mode are generated by the SAW performing multiple reflections between the respective central parts A3 and B3 in the propagation direction of the SAW of the one-way electrodes 3A and 3B, and even when electric charge energy induced in the electrode finger formation area 35 by its higher mode waves is leaked out in the vicinity of the bus bars 32a and 32b, the damper 41 absorbs the energy. Accordingly, it is possible to reduce the influence on the excitation of the respective interdigital transducers 33a and 33b by this energy. As a result, it is possible to reduce degradation of the amplitude characteristics (filter characteristic) of the SAW filter 2 caused by generation of the spuriousnesses.

In the SAW filter 2, though the damper 41 is applied on the terminals of the respective bus bars 32a and 32b, as described above, the SAW energy concentrates between the respective central parts A3 and B3 in the electrode finger formation area 35, and since the higher mode is a cause of the creation of the spuriousness in this electrode finger formation area 35, the damper 41 is not limited to being applied only on the terminals of the respective bus bars 32a and 32b, but by being applied on the bus bars 32a and 32b between the central part A3 of the one-way electrode 3A and the central part B3 of the one-way electrode 3B in the propagation direction of the SAW, creation of the spuriousnesses can be reduced.

As shown in FIG. 1 and FIG. 2, at the time of applying the dampers 41a and 41b in a circle, even when the center of the circle is not in the area between A3 and B3, if the end of the circle is in that extent, the effect of this invention is obtained. Therefore, it is also included in the claims of the present invention. In addition, the shield electrode 23 is not necessarily provided.

As described above, the damper 41 is preferably applied to the places near the electrode finger formation areas of the respective bus bars 32a and 32b on the extensional direction of the interdigital transducers 33a and 33b, because the damper 41 absorbs the energy leaked out from the electrode finger formation area 35 into the vicinity of the bus bars 32a and 32b. However, if the damper 41 is applied on the respective interdigital transducers 33a and 33b, degradation of the insertion loss occurs. Therefore, it is preferable to apply the damper not on the interdigital transducers 33a and 33b.

Figure 3:
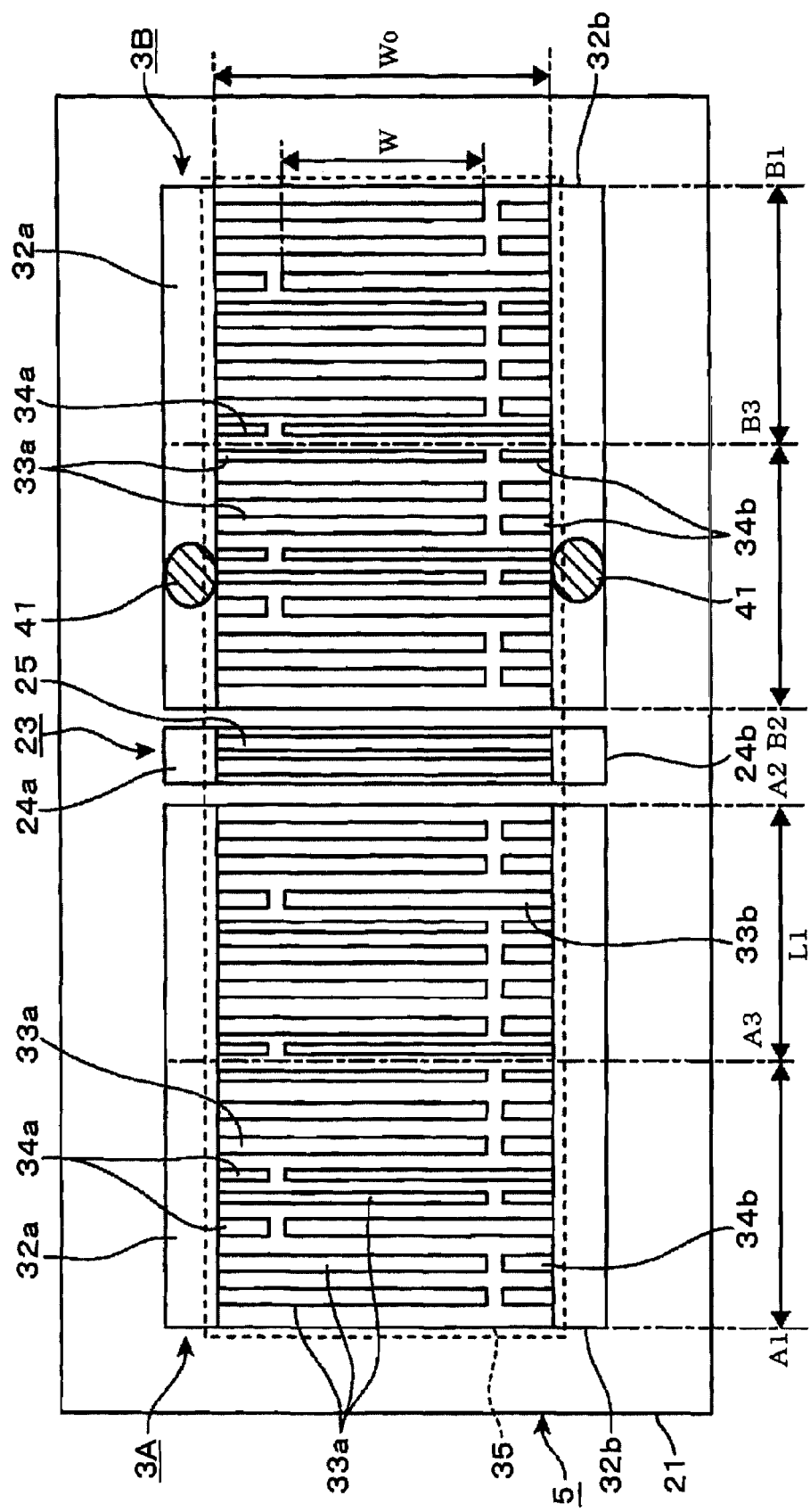
FIG. 3 is a view showing the whole configuration of a SAW filter relating to another embodiment of the present invention.

FIG. 3 shows a SAW filter 5 relating to another embodiment. In FIG. 3, the same symbols and numerals are attached to the respective parts configured similarly to the SAW filter 2, and the explanation thereof will be omitted. As shown in this drawing, the damper 41 is applied only on the bus bars 32a and 32b of the resonant single-phase unidirectional transducers 3B on the output side, and the position of application is on the side outer than that of the damper 41 in the SAW filter 2. However, it is included within the area between the input side terminal B2 and the central part B3 in the propagation direction of the SAW of the electrode 3B. The damper 41 may be applied on either one of the input side one-way electrode 3A or the output side one-way electrode 3B as described above. Furthermore, the damper 41 may be provided only on either one of the bus bars 32a or 32b, and in particular, when the SAW filter 5 is made of a crystal which is vertically asymmetrical as in the figure, since the profile in a spurious wave guide mode is sometimes asymmetrical, it is considered to have the possibility of sufficiently reducing the spuriousness by providing the damper 41 only on either one of the bus bar 32a or the bus bar 32b as above.

Embodiment

Evaluation Test 1

As an evaluation test 1, first, the respective electrodes 3A, 3B and 23, which configure the SAW filter 2 were formed on the piezoelectric substrate 21, and its filter characteristics were measured. After the measurement, the damper 41 was applied to the respective positions shown in FIG. 1, and then the pass band of the filter was measured again. The ratio (W/WO) of the aperture (W) of the electrode and the length of opening (WO) is 0.85. In other words, the filter used in the evaluation test 1 is that the damper 41 is removed from the SAW filter 2 before application of the damper 41 and that the same as the SAW filter 2 after application of the damper 41.

Figure 4:
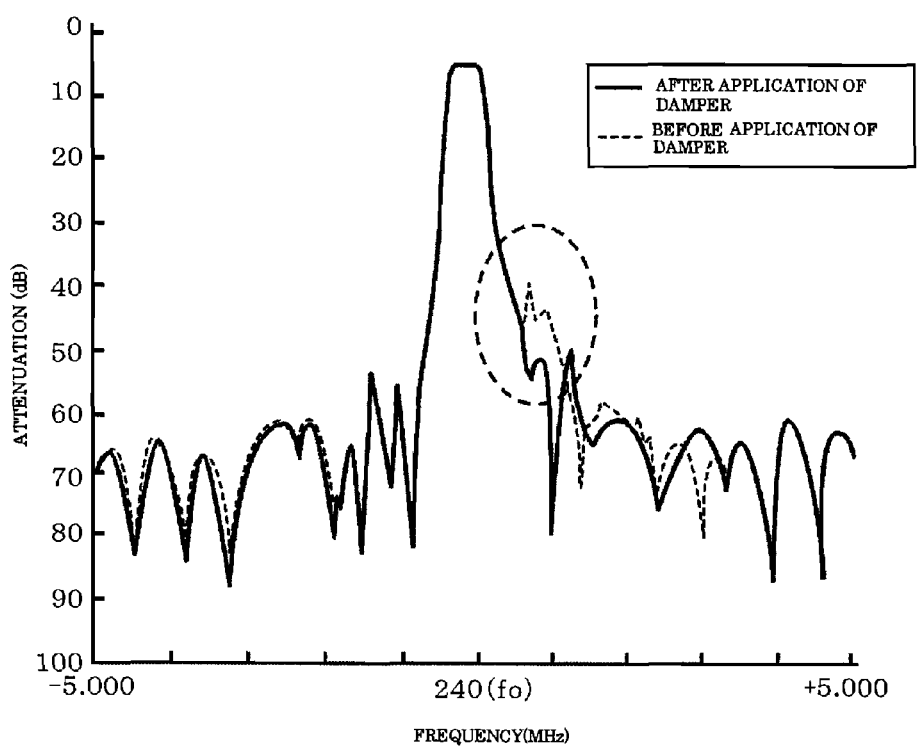
FIG. 4 is a graph showing a characteristic of the SAW filter in an evaluation test.

FIG. 4 shows the respective measurement results before and after application of the damper 41, the graph before application of the damper 41 is shown by a chain line, and the graph after application of the damper 41 is shown by a solid line. As is clear from these graphs, in the filter configured in this evaluation test, 240 MHz is taken as a pass band for both before and after application, and the bands higher and lower than 240 MHz are taken as damping bands. Before application of the damper, the spuriousness is generated as shown by the part surrounded by a chain line in the damping band on the frequency side higher than 240 MHz. However, after application of the damper, the spuriousness was reduced. From this result, though the spuriousness in a lateral mode cannot be reduced sufficiently with the conventional electrode configuration, it is verified that application of the damper to the appropriate position on the bus bar reduces the spuriousness and the out-of-filter characteristic (damping characteristic) of the filter can be improved.

Evaluation Test 2

As an evaluation 2, the respective electrodes 3A, 3B and 23, which configure the SAW filter 5 were formed on the piezoelectric substrate 21, and its filter characteristics were measured. After the measurement, the damper 41 is applied to the respective positions shown in FIG. 3, and after forming the respective electrodes similarly to the evaluation test 1, the respective pass bands before and after application of the damper were measured. In other words, the filter used in the evaluation test 2 is that the damper 41 is removed from the SAW filter 5 before application of the damper 41 and that the same as the SAW filter 5 after application of the damper 41. Provided that the ratio (W/WO) of the aperture (W) of the electrode and the length of opening (WO) was set to 0.74.

Figure 5:
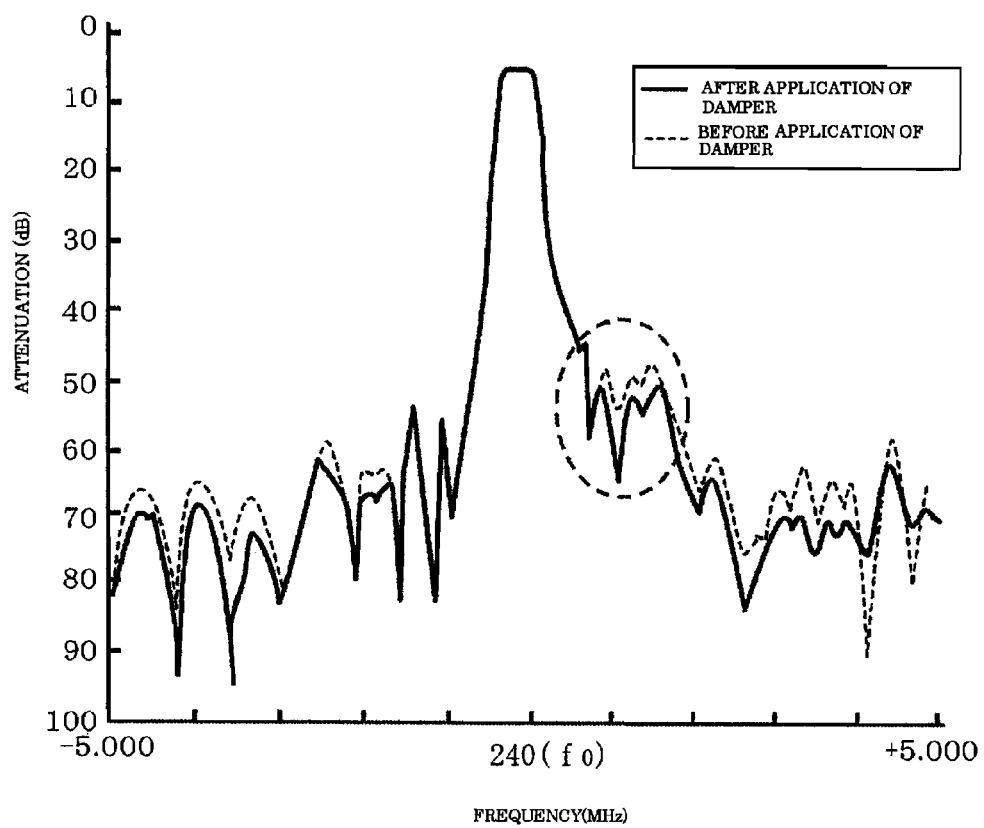
FIG. 5 is a graph showing a characteristic of the SAW filter in an evaluation test.

FIG. 5 shows the respective measurement results. The graph before application of the damper is shown by a chain line, and the graph after application of the damper is shown by a solid line respectively. Before application of the damper, similarly to the result of the evaluation test 1, the spuriousness is generated as shown by enclosing with a chain line in the damping band on the frequency side higher than 240 MHz, which is the center frequency. After application of the damper however, it is found from the graph that the spuriousness is reduced. Accordingly, similarly to the evaluation test 1, the spuriousness is reduced by application of the damper to an appropriate position on the bus bar, and the filter characteristics are also improved. Incidentally, the characteristic (waveform) of the spuriousness appeared in the area surrounded by a chain line in FIG. 5 differs from the characteristic (waveform) of the spuriousness appeared in the area surrounded by a chain line in FIG. 4. This is because the ratio of W/WO of the SAW filter 2 differs from that of the SAW filter 5.

Evaluation Test 3

Figure 6:
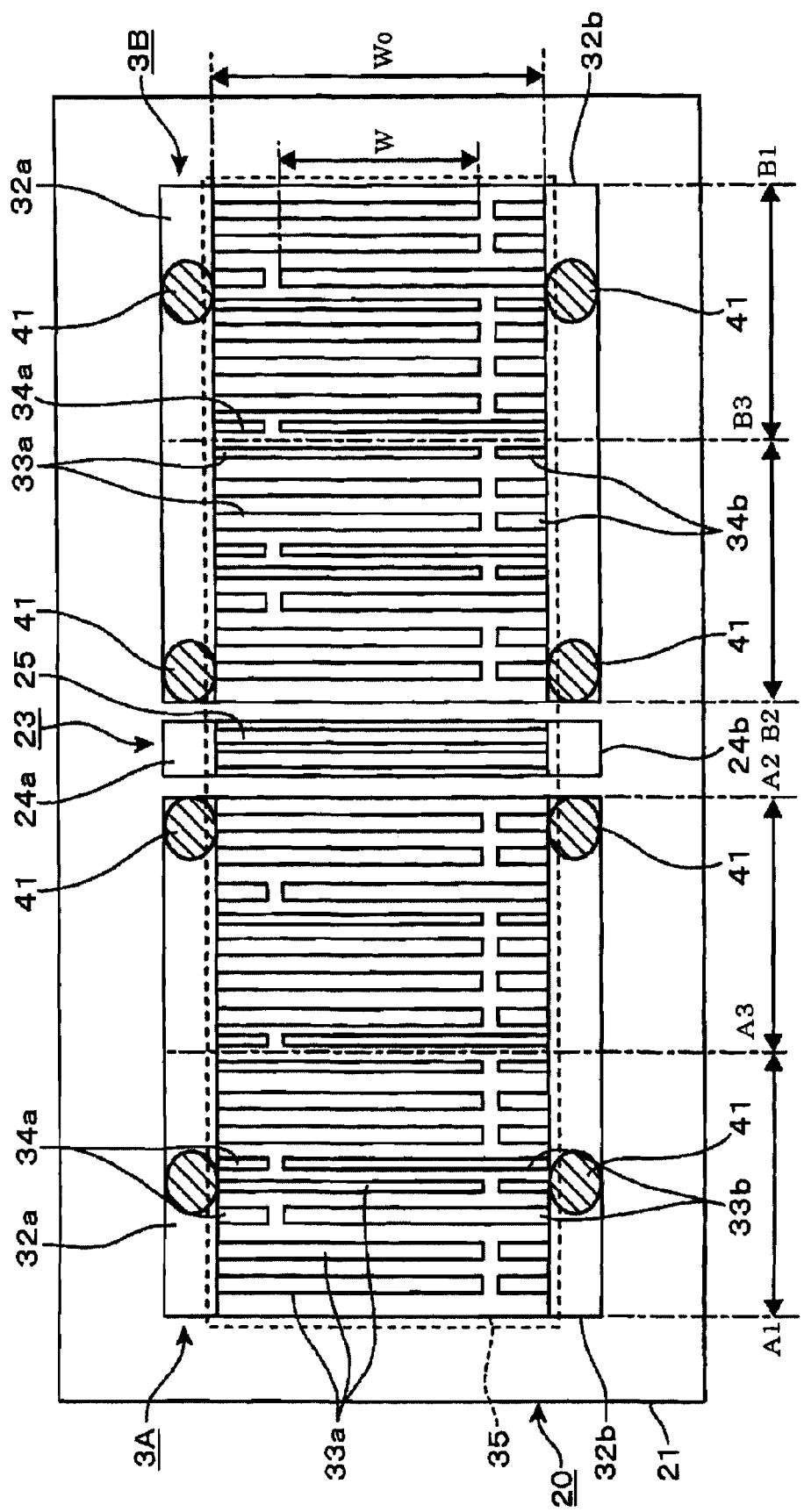
FIG. 6 is a view showing the whole configuration of the SAW filter used in the evaluation test.

As an evaluation test 3, first, a SAW filter 20 is formed as shown in FIG. 6. The SAW filter 20 is configured similarly to the SAW filter 2 in the embodiment shown first except that the number of positions where the damper 41 is applied is 8. Four positions among the positions where the damper 41 is applied in the SAW filter 20 are the same positions as the application positions of the damper to the SAW filter 2, and the other four application positions are outer side between the central parts A3 and B3 of the respective bus bars 32a and 32b of the one-way electrodes 3A and 3B in the propagation direction of the SAW. The amplitude characteristic (filter characteristic) of the SAW filter 20 and the SAW filter 2 is studied and the results are compared with each other.

Figure 7:
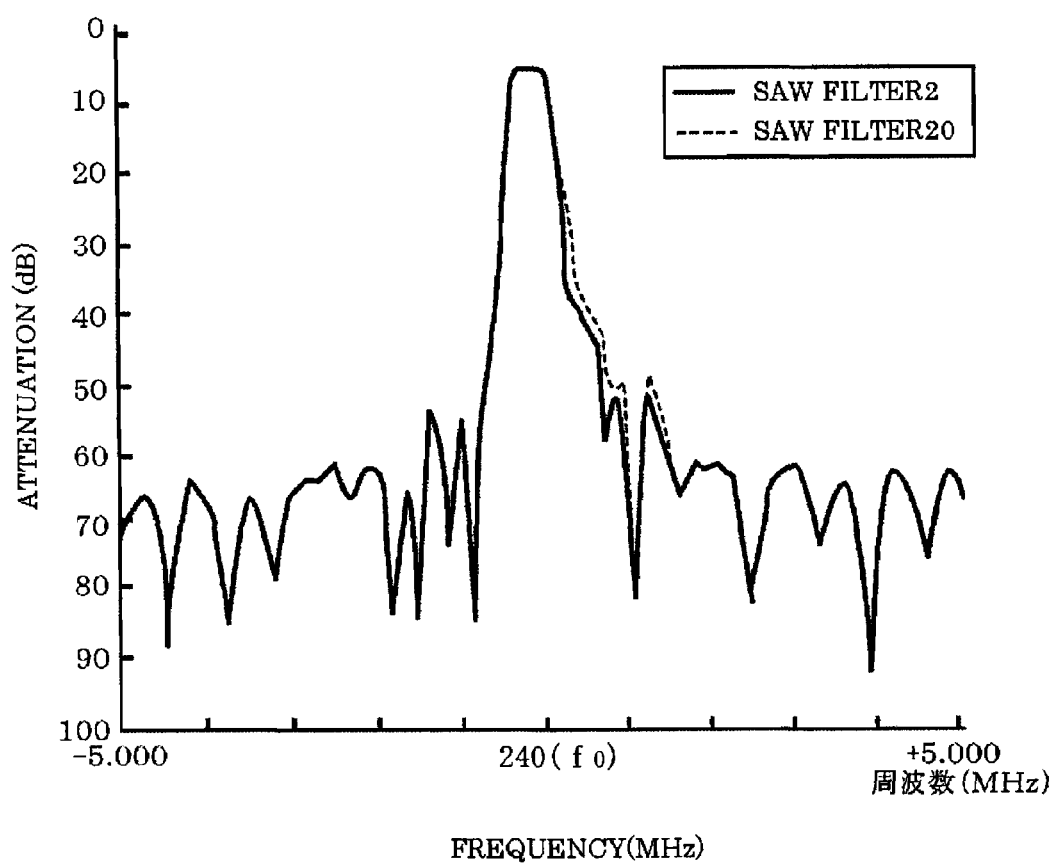
FIG. 7 is a graph showing a characteristic of the SAW filter in an evaluation test.

In FIG. 7, the filter characteristic of the SAW filter 2 is shown by a solid line, and the filter characteristic of the SAW filter 20 is shown by a chain line respectively. As shown in this drawing, there is little difference between these two filter characteristics. From the above, it is found that when the damper is applied to an appropriate area of the bus bar, spuriousness reduction effect can be obtained and even when the damper is further applied to other area, the effect is the same.

Evaluation Test 4

Figure 8:
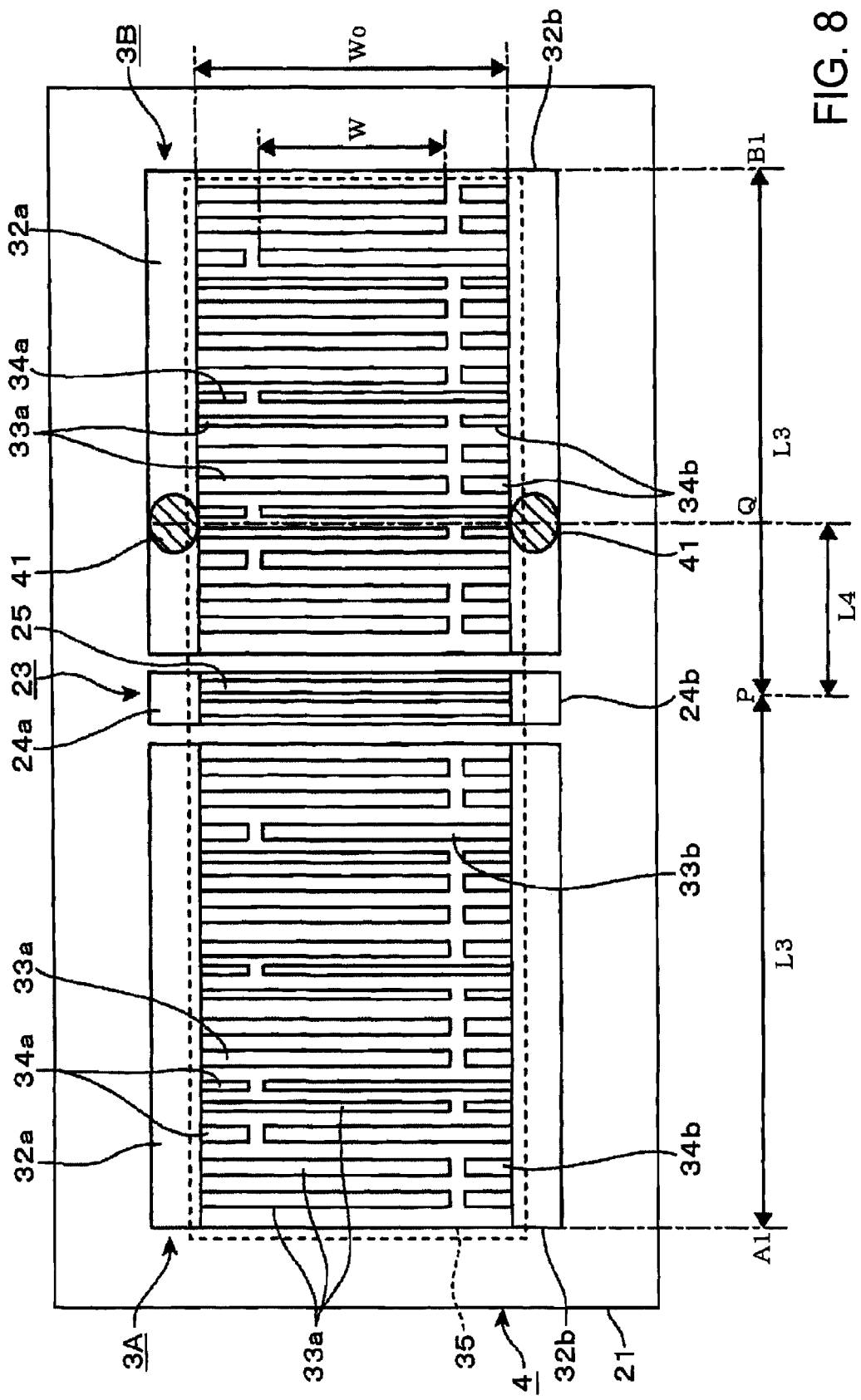
FIG. 8 is a view showing the whole configuration of the SAW filter used in the evaluation test.

Each electrode composing the SAW filter 5 is formed on the plural piezoelectric substrates 21 to prepare a filter sample, and the filter characteristic of each sample was measured before applying the damper similarly to the evaluation test 2. Thereafter, for the respective samples, the damper 41 is applied on the respective bus bars 32a and 32b of the output side resonant single-phase unidirectional transducers 3B while varying the position for every sample, the filter characteristic was measured after application, and an improvement in the level of spuriousness was studied. As shown in FIG. 8, the center between the input side terminal A1 of the one-way electrode 3A and the output side terminal B1 of the one-way electrode 3B is taken as P, the length between the center P and the output side terminal B1 of the electrode 3B is taken as L3, the center of the place on which the damper 41 is to be applied is taken as Q, and the length between P and Q is set as L4 respectively, the damper 41 was applied to the bus bars 32a and 32b of the respective samples on the positions thereof where the values of L4/L3 are 0.1, 0.2, 0.4 and 0.6 respectively.

Figure 9:
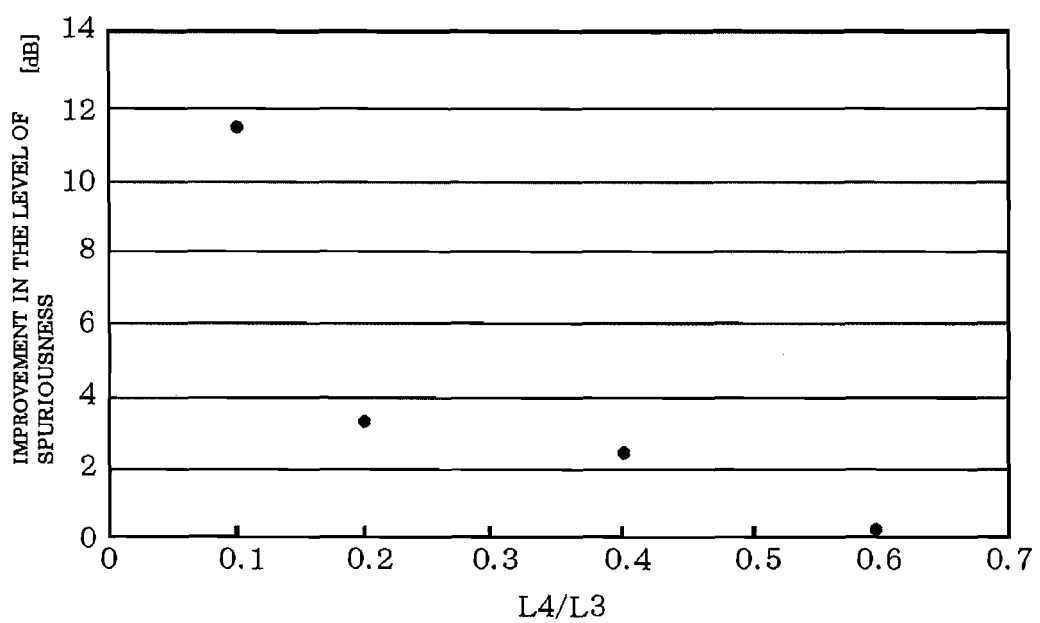
FIG. 9 is a graph showing the improvement level of the spuriousnesses when the point of application of the damper is varied.
Figure 10:
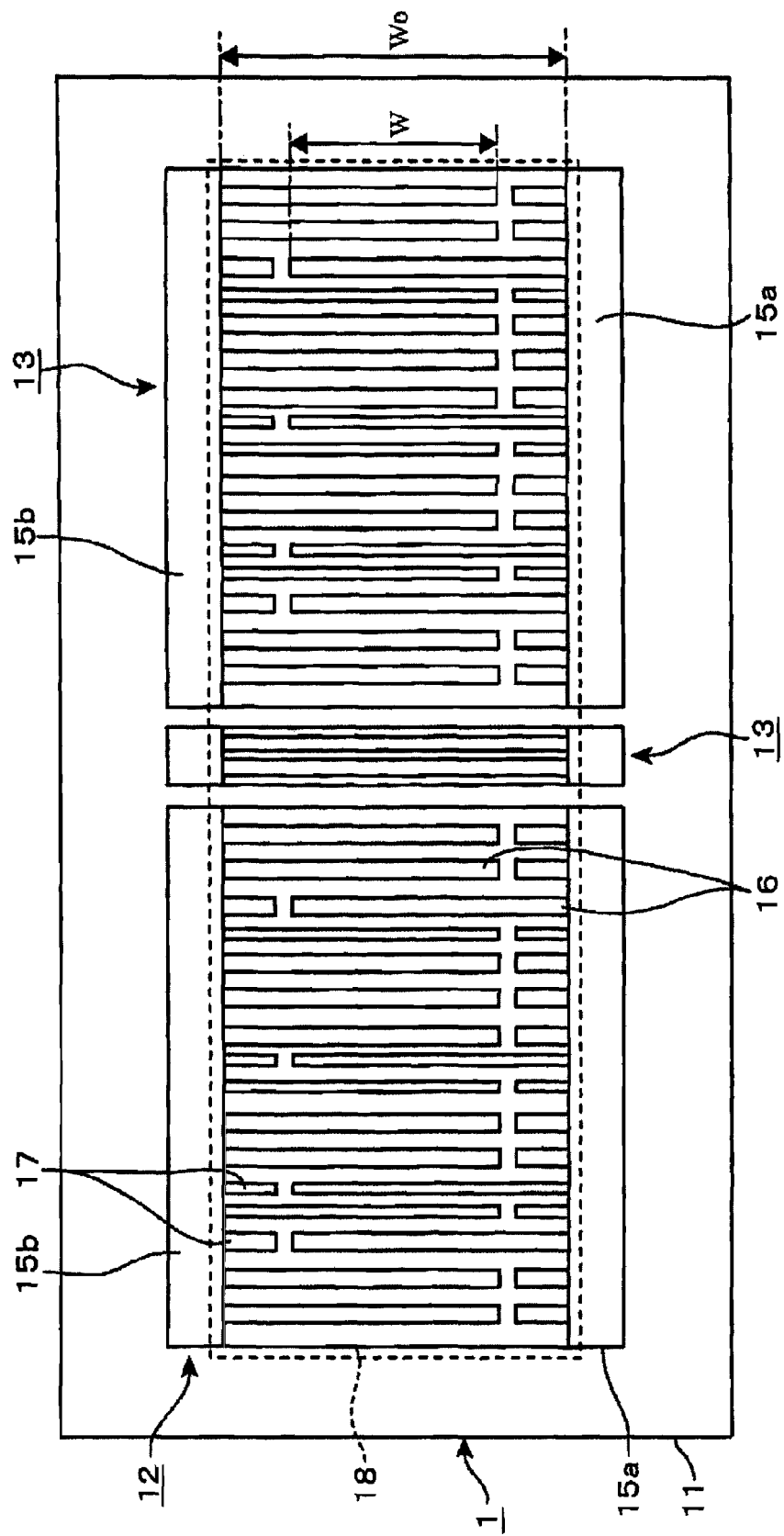
FIG. 10 is a view showing the whole configuration of a conventional SAW filter.
Figure 11A:
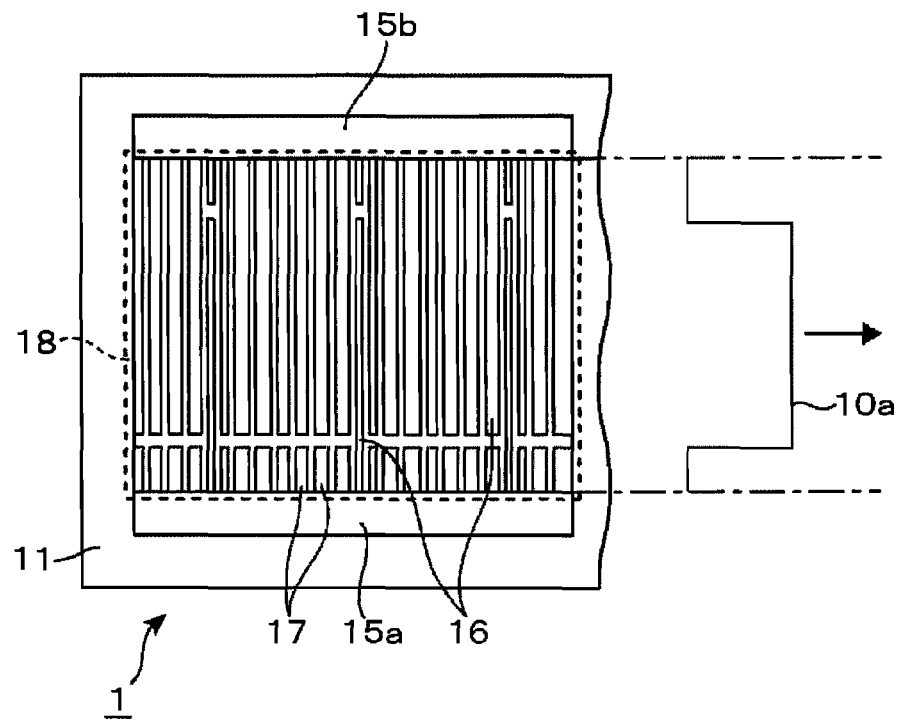
FIG. 11 is an explanatory view showing the manner of propagation of a surface acoustic wave in the higher mode in the above-described SAW filter.
Figure 11B:
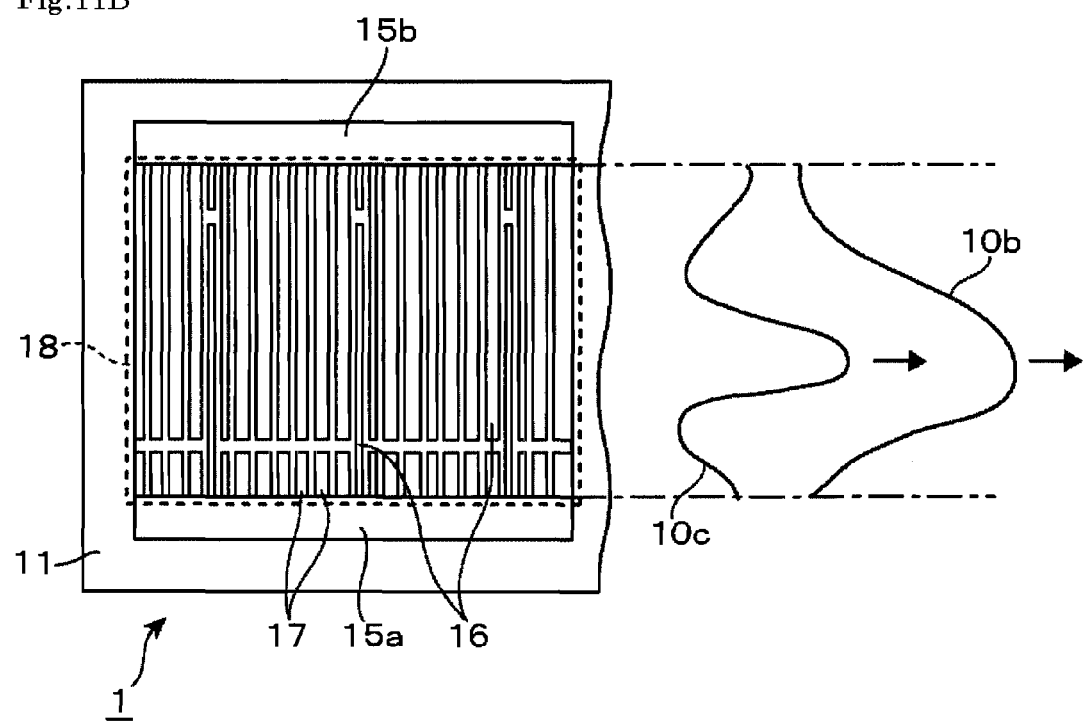
Figure 12:
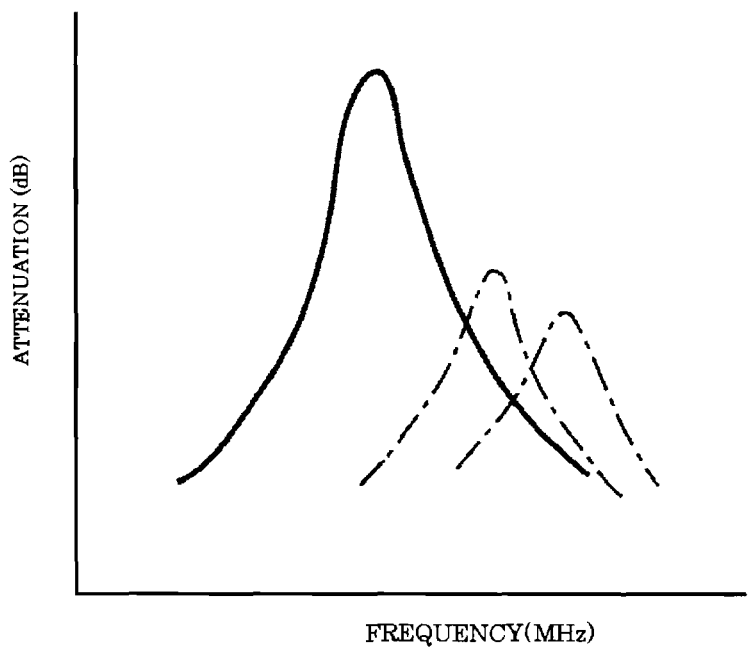
FIG. 12 is a graph explaining the manner of creation of spuriousnesses when the above-described SAW filter is used.
Figure 12:
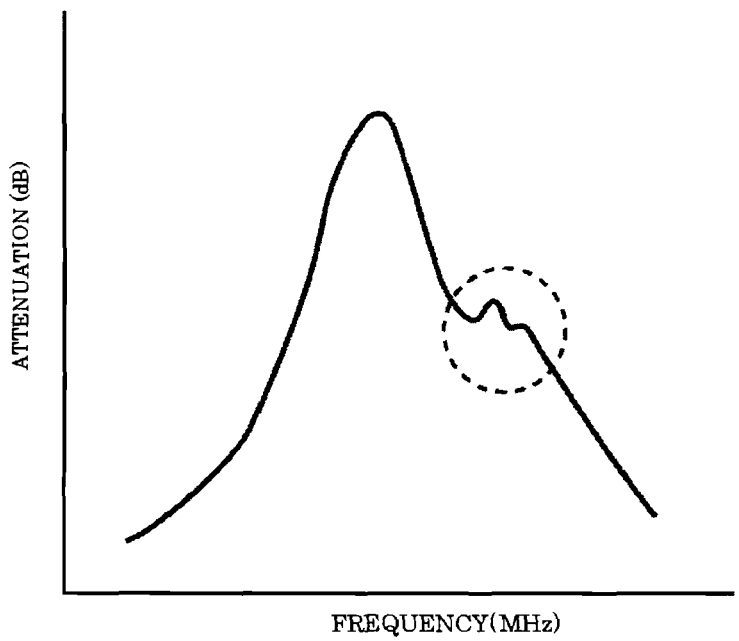

FIG. 9 is a graph displaying the results of the above-described measurement, the value of L4/L3 is set on the horizontal axis and the improvement level is set on the vertical axis respectively. As shown in the graph, it is found that the value of L4/L3 is small. In other words, when the damper 41 is near the center side of the electrode finger formation area 35 in the propagation direction of the SAW as close as possible, the improvement level is high, and as the value of L4/L3 increases, the improvement level is reduced. When the improvement level is 0.6, the effect of the damper almost disappears. When L4/L3 is 0.4, the damper 41 is in the area between the central part B3 in the propagation direction of the SAW of the one-way electrode 3B and the input side terminal B2, and when L4/L3 is 0.6, the dampers 41a and 41b is out of the above-described area. From this evaluation test, it is found that the spuriousness improvement level changes according to the position of application of the damper, and when its position of application of the damper is away from the area between the central part B3 and the input side terminal B2, the spuriousness is hardly improved at all.

What is claimed is:

1. An elastic wave device providing:
   an input side electrode which is a resonant single-phase unidirectional transducers provided with a pair of input side bus bars opposing to each other on a piezoelectric substrate;
   an output side electrode which is a resonant single-phase unidirectional transducers disposed on the extension line of the respective input side bus bas on the piezoelectric substrate, and provided with a pair of output side bus bars opposing to each other;
   a number of excitation electrode fingers extending into a comb-teeth shape so as to cross each other between these input side bus bar, output side bus bar from the respective input side bus bars and the respective output side bus bars, for the purpose of conducting repeated reflection and amplification of elastic waves between the central part of the input side electrode and the central part of the output side electrode along the direction of extension of the respective bus bar to propagate the elastic waves from the input side electrode to the output side electrode; and
   a damper provided at least on either one of the input side bus bar or the output side bus bar in an area between the central part of the input side electrode in the direction of movement of the elastic waves and the central part of the output side electrode in the direction of movement of the elastic waves.

2. The elastic wave device according to claim 1, further comprising:
   a shield electrode lying between said input side electrode and said output side electrode.

3. The elastic wave device according to claim 1, wherein the value obtained by dividing the distance from the central part between the input side terminal of the input side bus bar and the output side terminal of the output side bus bar to the position where the damper is applied, with the distance from the central part to the input side terminal of the input side bus bar or the distance from the center to the output side terminal of the output side bus bar is 0.2 or less.

4. The elastic wave device according to claim 1, wherein said damper is applied so as not to fall on the electrode finger.

5. The elastic wave device according to claim 1, further comprising:
   a dummy electrode for neutralizing the electric charge in the electrode finger formation areas surrounded by the respective input side bus bar and output side bus bar which extend from the opposing bus bars, on the extension of excitation electrode fingers in the input side bus bar and the output side bus bar.

* * * * *